United States Patent [19]

Comparini et al.

[11] 3,955,109

[45] May 4, 1976

[54] CRYSTAL RESONATOR OF (YZW)θ ORIENTATION HAVING A THICKNESS TO WIDTH RATIO OF LESS THAN ONE

[75] Inventors: Albert Anthony Comparini, Bethlehem; John Joseph Gallo, Center Valley, both of Pa.

[73] Assignee: Bell Telephone Laboratories, Incorporated, Murray Hill, N.J.

[22] Filed: Nov. 29, 1974

[21] Appl. No.: 528,037

[52] U.S. Cl. .............................................. 310/9.5
[51] Int. Cl.$^2$ ....................................... H01L 41/18
[58] Field of Search .......................... 310/8, 9.5, 9.6

[56] References Cited
UNITED STATES PATENTS

| | | | |
|---|---|---|---|
| 3,461,408 | 8/1969 | Onoe et al. | 310/9.5 X |
| 3,591,813 | 7/1971 | Coquin | 310/9.5 |
| 3,601,639 | 8/1971 | Hannon | 310/9.5 |
| 3,735,161 | 5/1973 | Perkins | 310/9.5 |
| 3,858,065 | 12/1974 | Epstein | 310/9.5 |

OTHER PUBLICATIONS

Determination of Elastic and Piezoelectric Constants for Crystals in Class (3m), by Warner et al., J.A.S.A., Vol. 42, No. 6, 1967, pp. 1223–1231.
High–Performance LiNbO$_3$ Acoustic Surface Wave Transducers and Delay Lines, by Collins et al., Applied Physics Letters, Vol. 13, No. 9, Nov. 1968, pp. 312, 313.

*Primary Examiner*—Mark O. Budd
*Attorney, Agent, or Firm*—S. Sherman; L. C. Canepa

[57] ABSTRACT

Spurious modes related to the slow shear mode in an $\overline{X}$-cut lithium tantalate crystal are suppressed and/or eliminated by reducing the ratio of plate dimension along the slow shear direction ($y'$) to the dimension along the $\overline{X}$ direction. Undesired modes associated with the flexural family of modes can be separated in frequency from the desired, fast shear mode by the "proper" ratio of plate dimension along the fast shear direction ($z'$) to the dimension along the $\overline{X}$ axis.

6 Claims, 3 Drawing Figures

CRYSTAL RESONATOR OF (YZW)θ ORIENTATION HAVING A THICKNESS TO WIDTH RATIO OF LESS THAN ONE

This invention relates to piezoelectric crystal resonators.

BACKGROUND OF THE INVENTION

Although the existence of a wide band, temperature stable, shear mode in $\overline{X}$-cut lithium tantalate plates has been known for several years, attempts at constructing resonators operating in this mode, referred to as the fast shear mode, have been frustrated by the large number of spurious resonances occurring in the immediate vicinity due to other, unwanted modes. Most of these unwanted modes result, either directly or indirectly, from the excitation of the other planar shear mode, referred to as the slow shear mode, and from a series of flexural modes directly coupled to the fast shear mode.

Accordingly, it is the broad object of the present invention to suppress or eliminate the unwanted modes related to the slow shear mode.

It is a further object of the invention to position the flexural modes so as to place them outside the frequency band of interest.

SUMMARY OF THE INVENTION

A crystal resonator, in accordance with the present invention, comprises a rectangular bar of trigonal crystal material having 3m point symmetry. The principal frequency determining dimension for the shear mode resonance lies along one of the three crystal $\overline{X}$ axes. The $z'$, or length axis of the bar lies in the crystallographic $\overline{Y}\,\overline{Z}$ plane at an angle $\theta$ to the crystal $\overline{Z}$ axis. The thickness dimension lies along a $y'$ axis, where the $\overline{X}$, $z'$ and $y'$ axes are all mutually perpendicular to each other.

In the case of a resonator using a lithium tantalate crystal, the $z'$ axis is rotated approximately 35° relative to the crystal $\overline{Z}$ axis, to form a rectangular yzw 35° bar.

The crystal thickness, $t$, relative to the crystal width, $w$, is chosen such that the slow shear mode resonance occurs at a higher freqency than the fast shear mode resonance. This typically occurs, for $t/w$ ratios of less than one. The location of the adjacent flexural mode resonances is then located relative to the desired fast shear mode resonance by the "proper" adjustment of the ratio of the crystal dimension, $l$, along the fast shear direction ($z'$) to the crystal dimension, $w$, along the crystal $\overline{X}$ direction. Typical $l/w$ ratios are ten or less.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
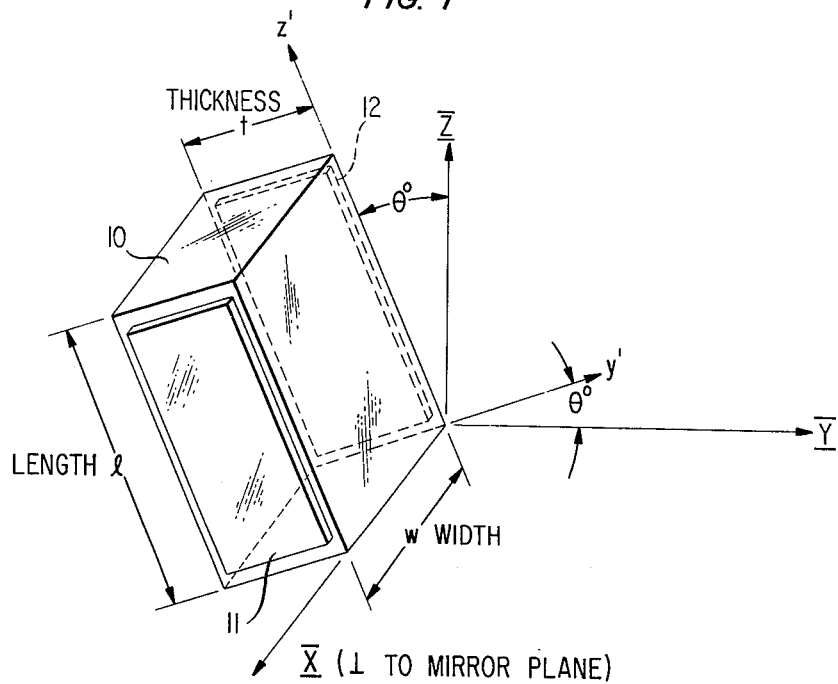
FIG. 1 shows a crystal resonator in accordance with the present invention.

Referring to the drawings, FIG. 1 shows a crystal resonator 10 in accordance with the present invention. More specifically, the resonator is a rectangular bar of trigonal crystal material having 3m point symmetry, as defined by the International Point Group classification system. Materials of particular interest in this group include lithium tantalate and lithium niobate. The principal frequency determining dimension for the shear mode resonances is the width which lies along one of the three crystal $\overline{X}$ axes (i.e., normal to one of the crystal mirror planes). The $z'$, or length axis of the bar lies in the crystallographic $\overline{Y}\,\overline{Z}$ plane at an angle of $\theta$ degrees from the crystal $\overline{Z}$ axis. The thickness dimension lies along the $y'$ axis, where the $\overline{X}$, $y'$ and $z'$ axes are all mutually perpendicular to each other.

A pair of metallic electrodes 11 and 12 are deposited along the two opposite crystal surfaces normal to the crystal $\overline{X}$ axis.

The disclosure of a wide band (low capacitance ratio, i.e., $\approx 7$), temperature stable, shear mode in $\overline{X}$-cut lithium tantalate crystals was made by Warner and Ballman ("Low Temperature Coefficient of Frequency in a Lithium Tantalate Resonator," by A. W. Warner and A. A. Ballman, Proc. IEEE (Letters), Vol. 53, page 450, March 1967). The fast shear mode, which can be driven piezoelectrically by an electric field applied along one of the three crystal $\overline{X}$ directions (i.e., normal to a mirror plane), has its polarization vector in the corresponding $\overline{Y}\,\overline{Z}$ plane at an angle of approximately 35° measured counterclockwise from the positive $\overline{Z}$ axis. Unfortunately, for many applications of interest, an electric field applied along the $\overline{X}$ direction also excites another, lower frequency, planar shear mode which exhibits a narrower bandwidth and a poorer temperature stability. Since this second mode propagates at a slower velocity, it is referred to as the "slow" shear mode in contrast to the higher frequency, wide band, "fast" shear mode.

Even in the infinite plate idealization, the two shear modes are coupled elastically and piezoelectrically by the boundary conditions along the major surfaces, at least for the technically important case of traction-free surfaces. In the practical case of a rectangular finite plate, the edge constraints couple the shears into two strongly driven sets of resonances, each composed primarily of shear, flexure and twist waves. Since both sets of shear-related waves are excited, the density of resonances in the vicinity of the fundamental shear mode is high. The combination of high unwanted mode density and wide bandwidth makes use of this mode very difficult.

It has been discovered, however, that the spurious shear modes associated with the slow shear can be shifted out of the band of interest by appropriately orienting the crystal edges and proportioning the crystal dimensions. Specifically, the two edges are cut so that they are normal to the polarization vectors of the fast and slow shear modes. Since, in lithium tantalate, the fast shear is oriented at an angle of approximately 35° to the $\overline{Z}$ axis, and the slow shear is oriented perpendicular to the fast shear, the preferred angular orientation $\theta$ for lithium tantalate is approximately 35° ± 5°.

Since the strong resonances associated with each planar dimension increase in frequency with a decrease in that dimension (more accurately with a decrease in the ratio of that dimension to the dimension along the X axis), it has been further discovered that the frequencies of the entire family of slow shear modes can be shifted relative to the fast shear mode. In particular, by making the ratio of the thickness, $t$, to the width, $w$, sufficiently small, the frequencies of the entire slow shear family of modes can be made higher than the fundamental frequency of the fast shear mode, thus placing this entire class of modes outside the frequency band of interest. In particular, it has been found that this occurs for ratios, of $t/w$ that are less than unity.

Several shear mode resonators have been fabricated in accordance with the teachings of the present invention. The widths of the bars were 0.060 and 0.048 inch; the thicknesses were fixed at 0.020 inch; the lengths ranged from 0.340 to 0.525 inch. Evaporated chromegold electrodes where applied to the $y'z'$ faces in amounts of 500 Angstroms and 2000 Angstroms, respectively. All units were supported by 0.003 inch diameter wire soldered to the metal electrodes on opposite faces and at opposite ends of the bar. The crystals were then vacuum sealed in crystal unit enclosures. Measurements, made for five different units over the temperature range of −25°C, to +60°C. are given below.

The present invention is based upon the results of analytical and experimental studies which disclosed that the unwanted modes related to the slow shear can be suppressed and/or eliminated by: (a) aligning the plate edges perpendicular to the direction of the polarization vectors of the fast and slow shears; (b) reducing the ratio of plate dimension ($t$) along the slow shear direction ($y'$) to the dimension ($w$) along the crystal $\overline{X}$ direction; while (c) the unwanted flexural family of modes can be separated in frequency from the fast shear by the "proper" selection of plate dimension ($l$) along the fast shear direction ($z'$) to the dimension ($w$) along the crystal $\overline{X}$ axis. In general, what is "proper" will depend in each case upon the particular application at hand. However, inasmuch as the spacing between adjacent flexural modes is greatest for ratios of $l/w$ of less than 10, ratios in this range are advantageously employed.

Models have been fabricated according to the design criteria derived from these studies. Measurements of these units show capacitance ratios of 6 to 9; inductances of 60 to 100 mH; Q values up to 70,000; resistances of 18 to 30 ohms; and an absence of unwanted responses ±10 percent from the main resonance. Over

| Sample Unit | $l/w$ | Average Over T. R. −25°C to 60°C | | | | | Max. and Min. Over T.R. −25°C to 60°C | | TOT |
|---|---|---|---|---|---|---|---|---|---|
| | | fm (MHz) | Δf/fm | Co/C | Q | Co | R (ohm) | L (mh) | |
| 1 | 5.68 | 1.30 | .038% | 7 | 65100 | 1.15$_{pf}$ | 18, 9 | 96, 91 | −20°C |
| 2 | 6.4 | 1.32 | .014 | 11 | 65000 | 1.31 | 22, 15 | | −10 |
| 3 | 7.00 | 1.30 | .034 | 8 | 40000 | 1.43 | 23,13 | 84,82 | −18 |
| 4 | 7.05 | 1.30 | .010 | 9 | 25000 | 1.43 | 40,21 | 87.9, 73 | +12 |
| 5 | 8.75 | 1.29 | .026 | 8 | 29000 | 1.79 | 21, 18 | 73, 71 | −4 |

Figure 2:
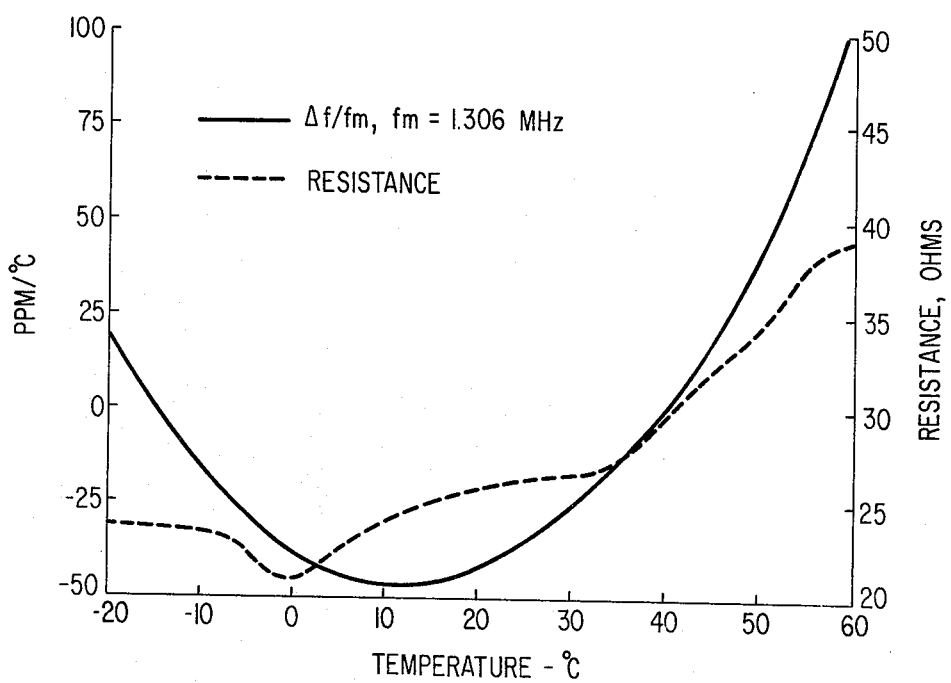
FIG. 2 shows a typical set of frequency and resistance curves for a resonator constructed in accordance with the teachings of the present invention.

A typical set of frequency and resistance curves is illustrated in FIG. 2. The smoothness of the curves and the relatively low values of resistance obtained for each unit imply that the shear response is not affected by unwanted modes.

Figure 3:
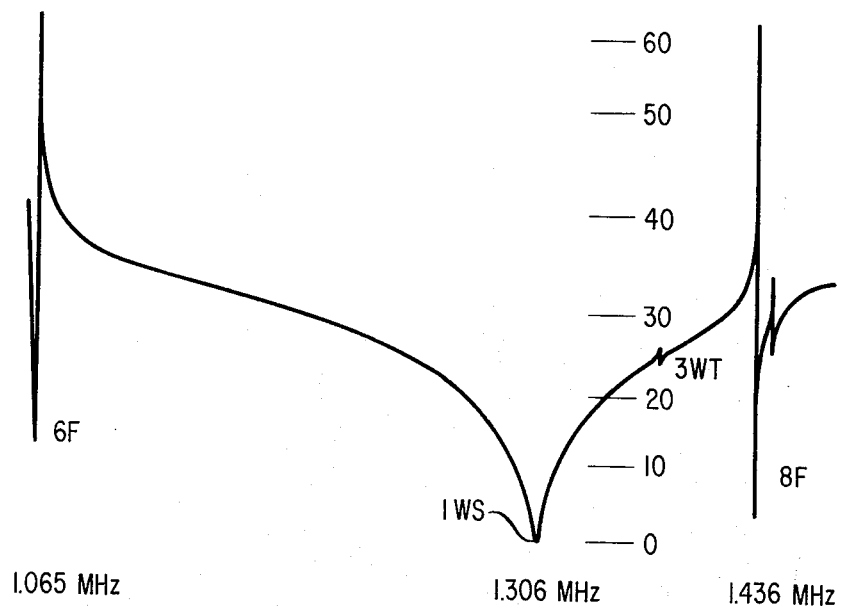
FIG. 3 shows a frequency scan of a resonator constructed in accordance with the teachings of the present invention.

To determine the positions and strengths of the unwanted modes, the units were frequency scanned in a standard half lattice scanning bridge. On all units measured, the twist modes were either too weak to measure or were suppressed to a level at least 25 dB below the width-shear mode. FIG. 3 shows a scan for the unit with a length-to-width ratio of 5.68. While this was not an optimum ratio, the scan nevertheless shows that the fundamental twist mode, which should occur at 1.17 MHz, is not measurable and that the third overtone at 1.34 MHz is greatly suppressed. The two strongest unwanted modes are the sixth and eighth flexures, at 1.065 MHz and 1.436 MHz, respectively, and each is at least 10 percent (130 KHz) or more removed from the desired width-shear resonance at 1.306 MHz.

SUMMARY

Although the existence of a wide band, temperature stable shear mode in $\overline{X}$-cut lithium tantalate plates has been known for several years, attempts at constructing resonators operating in this mode, referred to as the fast shear mode, have been frustrated by the large number of unwanted modes occurring in its immediate vicinity. Most of these unwanted modes result, either directly or indirectly, from excitation of the other planar shear mode, referred to as the slow shear, and from a series of flexural modes directly coupled to the fast shear.

a temperature range of −25° to +60°C., the resonant frequencies exhibit stabilities of 0.01 to 0.04 percent with a parabolic temperature dependence. Resistance and Q variation was, in each instance, less than 2 to 1 with a maximum resistance of about 30 ohms.

The sensitivity of turnover temperature to changes in dimensional ratio is predicted from theoretical studies. Based on this work, the turnover temperature of these resonators can be brought to room temperature by using the proper length to width ratio and crystallographic orientation.

While the test samples were made of lithium tantalate, the theoretical analyses upon which these samples were constructed relates, more generally to all trigonal crystals having 3m point symmetry, as defined by the International Point Group classification system. Thus, the conclusion derived from this analysis, and supported by the experimental results, is equally valid for other crystals of this general class such as, for example, lithium miobate. Thus, in all cases, it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A single crystal rectangular bar of trigonal material having 3m point symmetry and of ($yzw$) $\theta$ orientation having the width dimension, $w$, along one of the crystal $\overline{X}$ axes CHARACTERIZED IN THAT the thickness, $t$, dimension of said bar lies along an axis $y'$ parallel to the polarization vector of the slow shear mode;

the length, $l$, dimension of said bar lies along an axis $z'$ parallel to the polarization vector of the fast shear mode;

and in that the ratio of the thickness of said bar to the width of said bar is less than unity.

2. The crystal according to claim 1 wherein the ratio of the length of said bar to the width of said bar is equal to or less than 10.

3. A resonator comprising:

a crystal bar cut in accordance with claim 1;

and first and second metallic electrodes disposed, respectively, along the two crystal surfaces that are normal to the crystal $\underline{X}$ axis for impressing an electric field across the width of said crystal bar.

4. The crystal bar according to claim 1 wherein said material is lithium tantalate.

5. The crystal bar according to claim 1 wherein said material is lithium niobate.

6. A single crystal $(yzw)$ $\theta$ bar of lithium tantalate having the width dimension, $w$, along one of the crystal $\underline{X}$ axes CHARACTERIZED IN THAT the thickness, $t$, and the length, $l$, dimensions of said bar lie along a pair of $y'$ and $z'$ axes, respectively, where said $\underline{X}$, $y'$ and $z'$ axes are mutually perpendicular to each other, and said $y'$ and $z'$ axes are rotated 35± 5° counter clockwise with respect to the positive crystal $\underline{Y}$ and $\underline{Z}$ axes, respectively;

and in that the ratio $t/w$ is less than unity.

* * * * *